United States Patent [19]

Takakura et al.

[11] Patent Number: 4,958,222

[45] Date of Patent: Sep. 18, 1990

[54] SEMICONDUCTOR INTEGRATED CIRCUIT DEVICE

[75] Inventors: Hiroshi Takakura, Kawasaki; Tetsuya Iida, Yokohama; Junkei Goto, Kawasaki, all of Japan

[73] Assignee: Kabushiki Kaisha Toshiba, Kawasaki, Japan

[21] Appl. No.: 363,759

[22] Filed: Jun. 9, 1989

[30] Foreign Application Priority Data

Jun. 10, 1988 [JP] Japan ................. 63-141769

[51] Int. Cl.$^5$ .............. H01L 25/04; H01L 23/48; H01L 29/52; H01L 29/46
[52] U.S. Cl. ......................... 357/84; 357/71; 357/68; 357/53; 357/40
[58] Field of Search ............ 357/40, 53, 68, 71, 357/84

[56] References Cited

U.S. PATENT DOCUMENTS

| | | | |
|---|---|---|---|
| 3,518,506 | 6/1970 | Gazes | 357/53 |
| 3,533,023 | 10/1970 | Friend et al. | 357/84 |
| 3,573,571 | 4/1971 | Brown et al. | 357/53 |
| 3,936,865 | 2/1976 | Robinson | 357/68 |
| 4,314,268 | 2/1982 | Toshioka et al. | 357/48 |
| 4,423,433 | 12/1983 | Imaizumi et al. | 357/51 |
| 4,514,749 | 4/1985 | Shoji | 357/68 |
| 4,580,156 | 4/1986 | Comizzoli | 357/53 |
| 4,796,084 | 1/1989 | Kamasaki et al. | 357/84 |

FOREIGN PATENT DOCUMENTS

| | | | |
|---|---|---|---|
| 57-27962 | 3/1981 | Japan | 357/84 |
| 56-126956 | 10/1981 | Japan | 357/84 |
| 57-104243 | 6/1982 | Japan | 357/84 |
| 58-53845 | 3/1983 | Japan | 357/84 |
| 58-190045 | 11/1983 | Japan | 357/84 |

OTHER PUBLICATIONS

Evrenidis, "Elimination of Ionic Fet's", IBM Tech. Disclosure, vol. 13, No. 11, Apr. 1971, p. 3344.
Lin, "Shielded Silicon Gaze Complementary MOS IC", IEEE Trans., vol. Ed-19, No. 11, Nov. 1972, pp. 1199-1207.
Cavaliere, "Reduction of Capacitive Coupling . . . ", IBM Tech. Disclosure, vol. 21, No. 12, May 1979, p. 4827.

Primary Examiner—Rolf Hille
Assistant Examiner—David Ostrowski
Attorney, Agent, or Firm—Finnegan, Henderson, Farabow, Garrett, and Dunner

[57] ABSTRACT

A signal interference prevention wiring is disposed between two wirings which are arranged in parallel for transmitting a signal, and the signal interference prevention wiring is held at a constant potential.

8 Claims, 6 Drawing Sheets

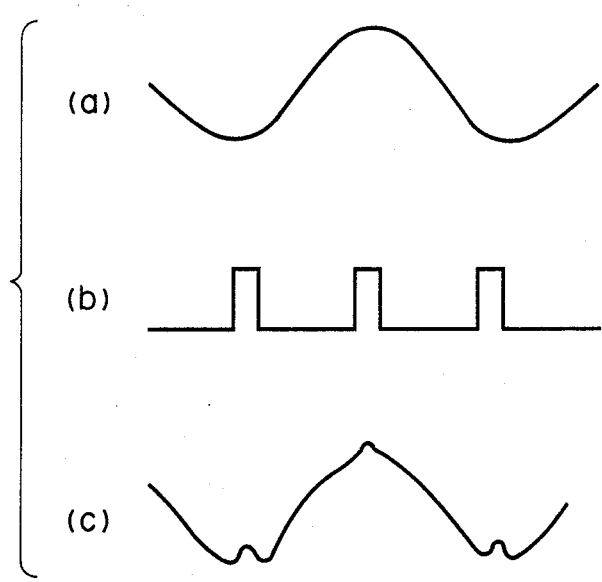
F I G. 2

SEMICONDUCTOR INTEGRATED CIRCUIT DEVICE

BACKGROUND OF THE INVENTION

1. Field of the Invention

This invention relates to a semiconductor integrated circuit device for preventing a signal interference between wirings.

2. Description of the Related Art

Recently, it has been strongly required to enhance the integration density of semiconductor integrated circuit devices, and the integration density has increased by further developing the element miniaturizing technique and multi-layered wiring technique. With the development of the element miniaturizing technique, the line width of the wiring and the distance between the wirings tend to be reduced. As the distance between the wirings becomes smaller, a signal interference between the wirings which can be neglected in the prior art becomes significant, thus making it difficult to effect the precise signal transmission.

FIG. 1 is a cross sectional view showing the schematic construction of the conventional semiconductor integrated circuit device. As shown in FIG. 1, wiring 81 formed of a first-layered conductive layer and wiring 82 formed of a second-layered conductive layer are disposed in insulation layer 80. Parasitic capacitances C0, C1 and C2 are present between wirings 81 and 82. Capacitance C0 represents an equivalent parasitic capacitance existing along a straight line passing those portions of wirings 81 and 82 which face each other, and capacitances C1 and C2 each represent an equivalent parasitic capacitance existing along an outwardly curved line passing side portions of wirings 81 and 82. Generally, capacitances C0, C1 and C2 have the relation of $C0 >> C1, C2$. Assume now that different signals or voltages are transmitted along wirings 81 and 82. For example, an analog signal shown in the waveform diagram of FIG. 2($a$) is transmitted along wiring 81 and a digital signal shown in FIG. 2($b$) is transmitted along wiring 82. When the signals are transmitted along wirings 81 and 82, interference signals occur because of the presence of parasitic capacitances C0, C1 and C2. As a result, the analog signal is influenced by the digital signal and a distortion component is introduced into the analog signal as shown in FIG. 2($c$). Therefore, it becomes impossible to correctly transmit the analog signal. Further, the semiconductor integrated circuit device having a miniaturized structure and a multi-layered wiring structure tends to be influenced by the peripheral wirings and subject to the signal interference caused therebetween, thus making it difficult to correctly transmit the signal.

SUMMARY OF THE INVENTION

Accordingly, an object of this invention is to provide a semiconductor integrated circuit device in which the element miniaturization structure and multi-layered wiring structure can be attained without increasing the signal interference between wirings and a precise signal transmission can be effected.

According to this invention, a semiconductor integrated circuit device comprising a semiconductor body; an insulation layer formed on the body; a plurality of first conductive layers formed in the insulation layer, for transmitting different signals; and a second conductive layer provided between the adjacent two of the first conductive layers and held at a constant potential are provided.

BRIEF DESCRIPTION OF THE DRAWINGS

FIG. 2 is a waveform diagram of signals transmitted by means of the device shown in FIG. 1;

DETAILED DESCRIPTION OF THE PREFERRED EMBODIMENTS

There will now be described an embodiment of this invention with reference to the accompanying drawings.

Figure 3:
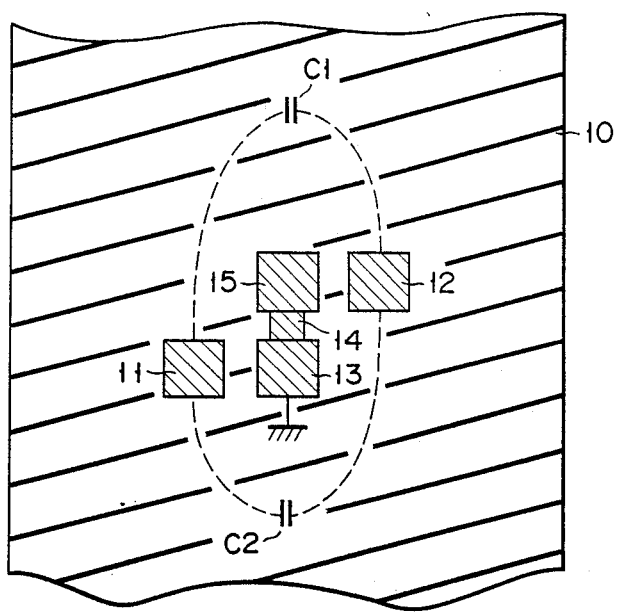
FIG. 3 is a cross sectional view showing the schematic construction of a semiconductor integrated circuit device according to this invention.

FIG. 3 is a cross sectional view showing the schematic construction of a semiconductor integrated circuit device according to this invention. As shown in FIG. 3, wiring 11 formed of a first-layered conductive layer and wiring 12 formed of a second-layered conductive layer are disposed in insulation layer 10. Wirings 11 and 12 are used to transmit different signals. Further, wiring 13 formed of the first-layered conductive layer and wiring 15 formed of the second-layered conductive layer and electrically connected to wiring 13 via contact hole 14 are arranged between wirings 11 and 12. Wirings 13 and 15 are held at a constant potential, for example, a ground potential or power source potential.

Figure 1:
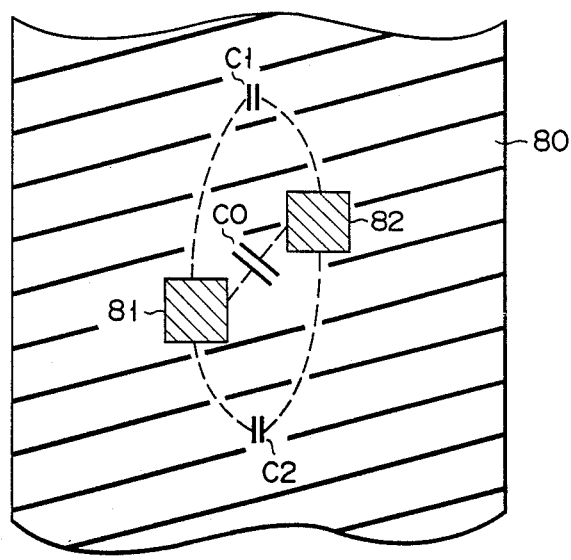
FIG. 1 is a cross sectional view showing the schematic construction of the conventional semiconductor integrated circuit device.

As described above, the wiring held at a constant potential is disposed between wirings 11 and 12 for transmitting different signals and therefore a capacitance corresponding to parasitic capacitance C0 shown in FIG. 1 will not be formed. That is, only capacitances corresponding to capacitances C1 and C2 occur as parasitic capacitances between wirings 11 and 12. In this case, as described before, the relation of $C0 >> C1, C2$ is generally set and the values of C1 and C2 can be suppressed to a sufficiently small value. As a result, influence of the signal interference between wirings 11 and 12 can be sufficiently suppressed owing to the presence of capacitances C1 and C2.

Now, various embodiments of this invention will be explained.

Figure 4:
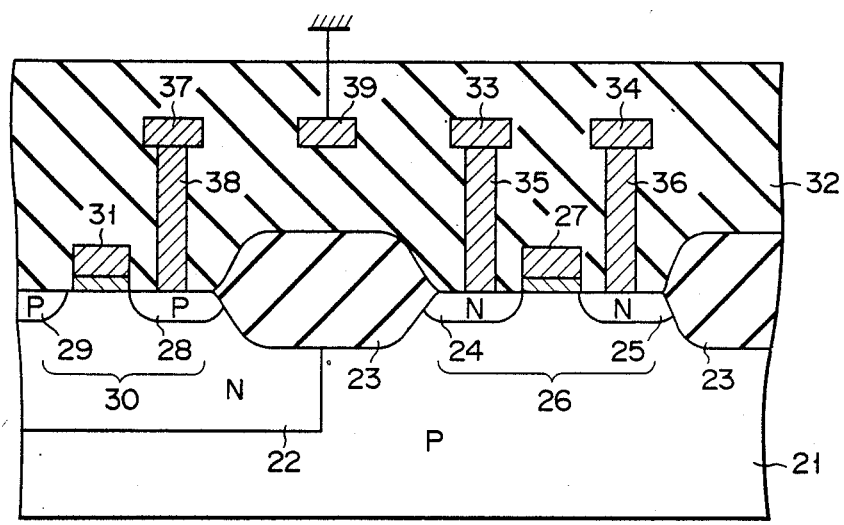
FIG. 4 is a cross sectional view showing the construction of a semiconductor integrated circuit device according to one embodiment of this invention.

FIG. 4 is a cross sectional view showing the construction of part of a CMOS semiconductor integrated circuit device according to one embodiment of this invention.

In FIG. 4, 21 denotes a P-type silicon substrate, 22 denotes an N-type well region formed in substrate 21, 23 denotes a field oxide film for element isolation, 24 and 25 denote the source and drain regions of N-channel MOS transistor 26 which are formed of N-type diffusion regions formed in the surface area of substrate 21, 27 denotes the gate electrode of N-channel MOS transistor 26 which is formed of a polycrystalline silicon layer, for example, 28 and 29 denote the source and drain regions of P-channel MOS transistor 30 which are formed of P-type diffusion regions formed in the surface area of N-type well region 22, 31 denotes the gate electrode of P-channel MOS transistor 30 which is formed of a polycrystalline silicon layer, 32 denotes an interlayer insulation layer formed of boron phospho-silicate glass (BPSG), phospho-silicate glass (PSG) or the like formed on the surface of substrate 21. Further, 33 denotes a drain wiring of N-channel MOS transistor 26 which is formed of aluminum, for example, in interlayer insulation layer 32, 34 denotes a source wiring of N-channel MOS transistor 26 which is formed of aluminum, for example, in interlayer insulation layer 32, 35 denotes a drain lead-out electrode formed of aluminum, for example, which is the same conductive material as drain wiring 33, for connecting drain wiring 33 and drain region 24 to each other, 36 denotes a source lead-out electrode formed of aluminum, for example, which is the same conductive material as source wiring 34, for connecting source wiring 34 and source region 25 to each other, 37 denotes a drain wiring of P-channel MOS transistor 30 which is formed of aluminum, for example, in interlayer insulation layer 32, 38 denotes a drain lead-out electrode formed of aluminum, for example, which is the same conductive material as drain wiring 37, for connecting drain region 28 and drain wiring 37 of P-channel MOS transistor 30 to each other.

Wiring 39 formed of metal such as aluminum and held at a constant potential, for example, ground potential is disposed between wirings 33 and 37 formed in interlayer insulation layer 32. In FIG. 4, the source wiring and source lead-out electrode of P-channel MOS transistor 30 are omitted.

Wirings such as wirings 33, 37 and 39 are formed to extend in a direction perpendicular to the drawing.

With the integrated circuit device of this embodiment, drain wiring 33 of N-channel MOS transistor 26 corresponds to wiring 11 of FIG. 3 and drain wiring 37 of P-channel MOS transistor 30 corresponds to wiring 12 of FIG. 3. Further, wiring 39 disposed between drain wirings 33 and 37 corresponds to wiring 13 or 15 of FIG. 3.

With the above construction, wiring 39 disposed between drain wirings 33 and 37 is held at the ground potential. Therefore, a parasitic capacitance occurring between drain wirings 33 and 37 can be suppressed to a minimum owing to the presence of wiring 39. As a result, even in a case where the distance between adjacent wirings becomes smaller as the dimensions of the wirings are reduced, influence by the signal interference occurring between drain wirings 33 and 37 can be suppressed to a minimum. Therefore, it becomes possible to correctly transmit signals along drain wirings 33 and 37.

Figure 5:
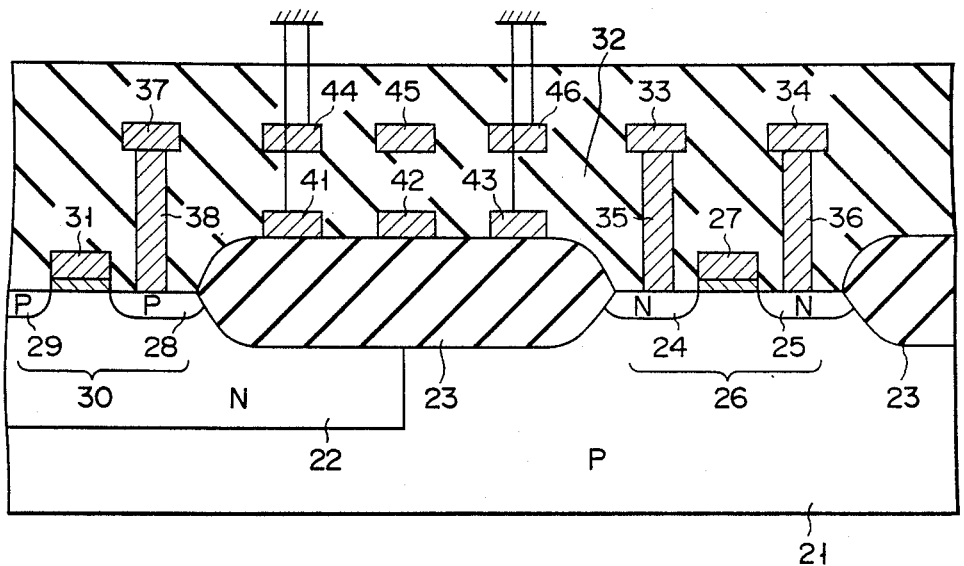
FIG. 5 is a cross sectional view showing the construction of a semiconductor integrated circuit device according to another embodiment of this invention.

FIG. 5 is a cross sectional view showing the construction of part of a CMOS semiconductor integrated circuit device according to another embodiment of this invention.

In the integrated circuit device of this embodiment, six electrodes 41 to 46 formed of aluminum, for example, are disposed in interlayer insulation layer 32 on field oxide film 23. Three wirings 41 to 43 among six wirings 41 to 46 are formed by depositing a firstlayered aluminum layer on the entire surface of the semiconductor structure and then patterning the deposited aluminum layer and the remaining wirings 44 to 46 are formed by patterning a second-layered aluminum layer. Wiring 42 of first-layered three wirings 41 to 43 is disposed at a central position between wirings 41 and 43. Likewise, wiring 45 of second-layered three wirings 44 to 46 is disposed at a central position between wirings 44 and 46. The six wirings 41 to 46 are also formed to extend in a direction perpendicular to the drawing.

Two wirings 42 and 45 which are disposed at the central position of the six wirings are used as wirings for connection with other circuits. The remaining four wirings 41, 43, 44 and 46 are held at a constant potential, for example, ground potential.

Further, in the device of this embodiment, drain wirings 33 and 37 and source wiring 34 are formed in the same manner as wirings 44 to 46 by depositing the second-layered aluminum layer and then patterning the deposited aluminum layer.

In the integrated circuit device of this embodiment, wiring 46 held at the ground potential is disposed between wiring 45 and drain wiring 33 of N-channel MOS transistor 26 and wiring 44 held at the ground potential is disposed between wiring 45 and drain wiring 37 of P-channel MOS transistor 30. As a result, even when signals are transmitted via drain wirings 33 and 37 and wiring 45, influence of the mutual interference of the signals can be suppressed to a minimum, making it possible to correctly transmit the signals by use of drain wirings 33 and 37 and wiring 45.

Further, in the device of this embodiment, wiring 43 held at the ground potential is disposed between wiring 42 and drain lead-out electrode 35 of N-channel MOS transistor 26 and wiring 41 held at the ground potential is disposed between wiring 42 and drain lead-out electrode 38 of P-channel MOS transistor 30. As a result, influence of the signal interference between wiring 42 and drain lead-out electrode 35 and that of the signal interference between wiring 42 and drain lead-out electrode 38 can be suppressed to a minimum.

In the above embodiment, wirings 41, 43, 44, 46 are all held at the ground potential. That is, the embodiment is made based on the fact that the signal interference between the wirings can be prevented by setting wirings 41, 43, 44, 46 at a constant potential. Therefore, it is easily understood that wirings 41, 43, 44, 46 may be set at a desired potential if it is constant. For example, they can be set at the power source potential instead of the ground potential. Further, it is not necessary to set all the wirings 41, 43, 44, 46 at the same constant potential.

Figure 6:
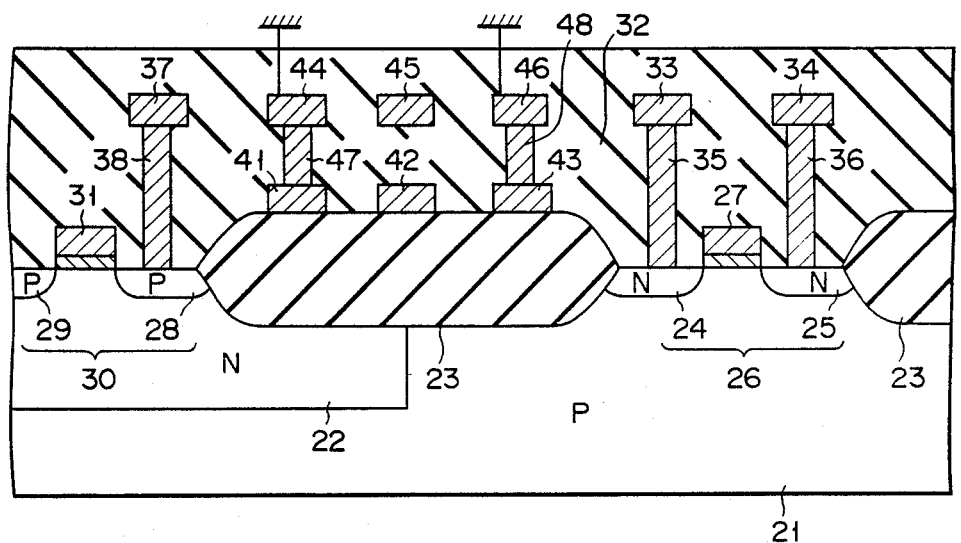
FIG. 6 is a cross sectional view showing the construction of a semiconductor integrated circuit device according to still another embodiment of this invention.

FIG. 6 is a cross sectional view showing the construction of part of a CMOS semiconductor integrated circuit device according to still another embodiment of this invention. In FIG. 6, portions which are the same as those of FIG. 5 are denoted by the same reference numerals and the explanation therefore is omitted.

In the integrated circuit device of this embodiment, wiring 44 and wiring 41 formed on field oxide film 23 are disposed to fill a penetration hole formed in interlayer insulation film 32, and are electrically connected to each other by means of connection electrode 47 formed of metal such as aluminum which is the same conductive material as wiring 44. Likewise, wiring 46 and wiring 43 formed on field oxide film 23 are disposed to fill a penetration hole formed in interlayer insulation film 32, and are electrically connected to each other by means of connection electrode 48 formed of metal such as aluminum which is the same conductive material as wiring 46.

Figure 7:
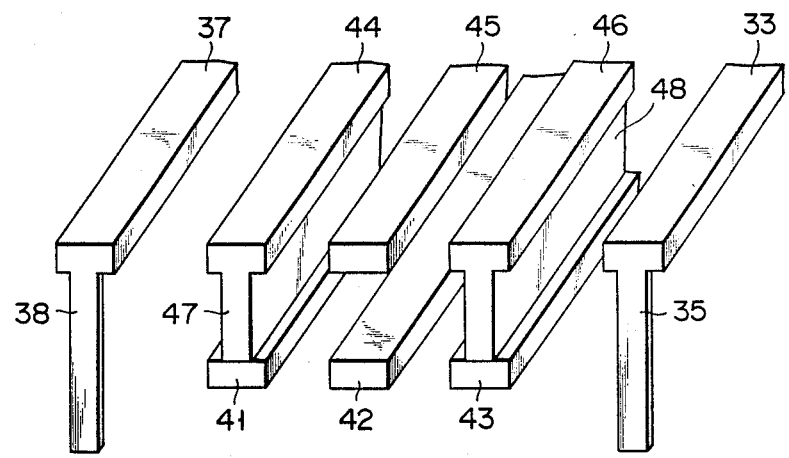
FIG. 7 is a perspective view of part of the semiconductor integrated circuit device shown in FIG. 6.

FIG. 7 discretely shows drain wirings 33 and 37, drain lead-out electrodes 35 and 38, wirings 41 to 46 and connection electrodes 47 and 48 of the device shown in FIG. 6. As shown in FIG. 7, wirings 41 and 44 and wirings 43 and 46 which are respectively connected via connection electrodes 47 and 48 are disposed to extend in the lengthwise direction of drain wiring 37 or 33 and wirings 42 and 45 which are disposed on both sides of the respective wirings and are formed in a wall configuration. The wirings formed in the wall configuration are disposed to separate drain wiring 33 or 37 from wirings 42 and 45.

In the integrated circuit device of FIG. 6 having the multi-layered structure, the wirings of different layers held at a constant potential are electrically connected by means of the connection electrodes and the wirings are formed in a wall configuration. As a result, the signal run-around effect can be prevented and influence of the signal interference between the wirings disposed on both sides of the wall-shaped wirings can be suppressed to a minimum.

Figure 8:
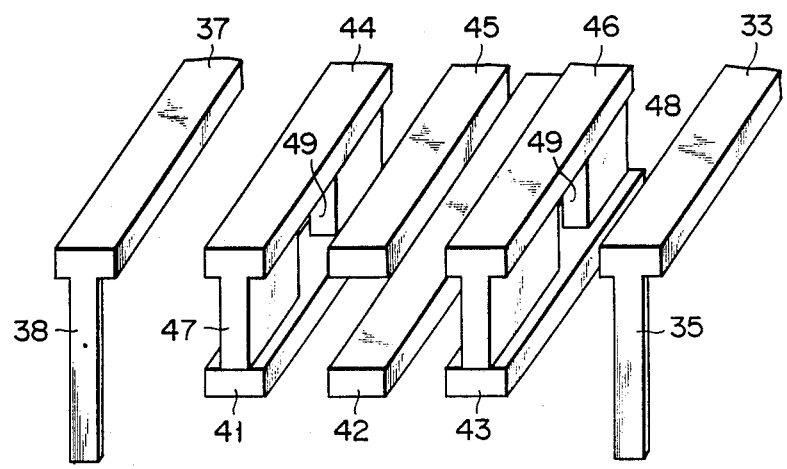
FIG. 8 is a perspective view of a modification of the semiconductor integrated circuit device shown in FIG. 6.

FIG. 8 is a modification of the embodiment of FIG. 6, and discretely shows portions corresponding to drain wirings 33 and 37, drain lead-out electrodes 35 and 38, wirings 41 to 46 and connection electrodes 47 and 48 of the device shown in FIG. 6. In this modification, a desired number of holes 49 are formed in desired portions of connection electrodes 47 and 48. That is, in this modification, connection electrode 47 for connecting wirings 41 and 44 and connection electrode 48 for connecting wirings 43 and 46 are divided into a plurality of electrode portions, and portions in which neither connection electrode 47 nor connection electrode 48 is formed, correspond to holes 49.

Figure 9:
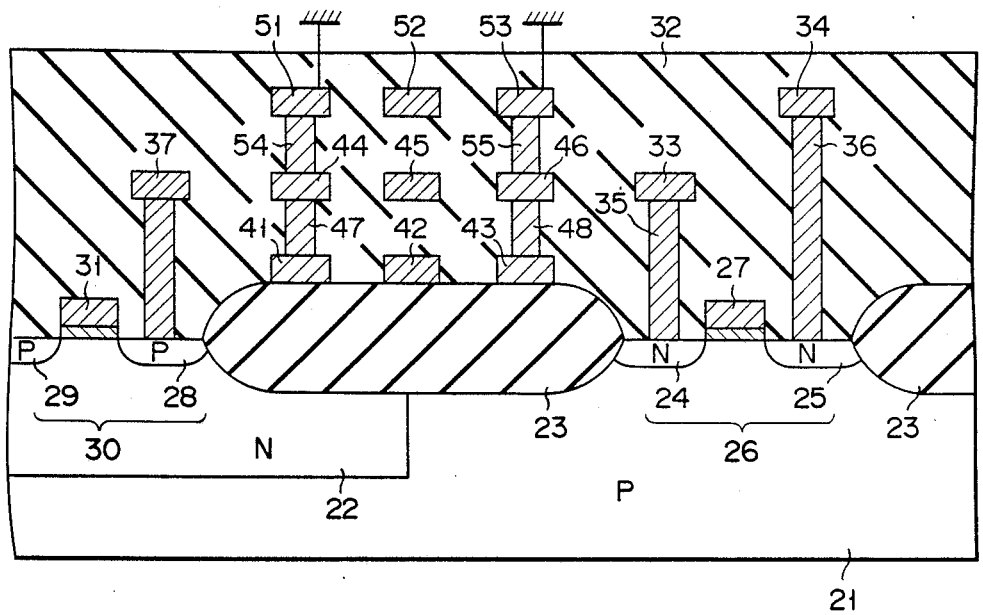
FIG. 9 is a cross sectional view showing the construction of a semiconductor integrated circuit device according to another embodiment of this invention.

FIG. 9 is a cross sectional view showing the construction of part of a CMOS semiconductor integrated circuit device according to another embodiment of this invention. In FIG. 9, portions which are the same as those of FIG. 6 are denoted by the same reference numerals and the explanation therefor is omitted.

In the integrated circuit device of this embodiment, wirings 41 to 43 are formed of a first-layered metal such as aluminum, wirings 44 to 46 are formed of a second-layered metal such as aluminum, and three wirings 51 to 53 are formed in interlayer insulation film 32 by depositing a third-layered metal such as aluminum on the entire portion of the semiconductor structure and then patterning the metal layer. Like wirings 42 and 45, central wiring 52 among three wirings 51 to 53 is used as a transmission signal wiring for signal transmission with respect to another circuit. Further, wirings 51 and 53 are used as signal interference preventing wirings. Wirings 51 and 44 are electrically connected to each other by use of connection wiring 54 formed of the same conductive material as wiring 51 and formed to fill a penetration hole formed in interlayer insulation film 32. Likewise, wirings 53 and 46 are electrically connected to each other by use of connection wiring 55 formed of the same conductive material as wiring 53 and formed to fill a penetration hole formed in interlayer insulation film 32. Wirings 41, 44 and 51 which are connected to each other are kept at the ground potential, and wirings 43, 46 and 53 which are connected to each other are also kept at the ground potential. Also, in the device of this embodiment, it is possible to hold the potential of wirings 41, 44 and 51 and wirings 43, 46 and 53 at a constant potential which is different from the ground potential. Further, it is not necessary to hold the potential of wirings 41, 44 and 51 and that of wirings 43, 46 and 53 at the same potential.

Figure 10:
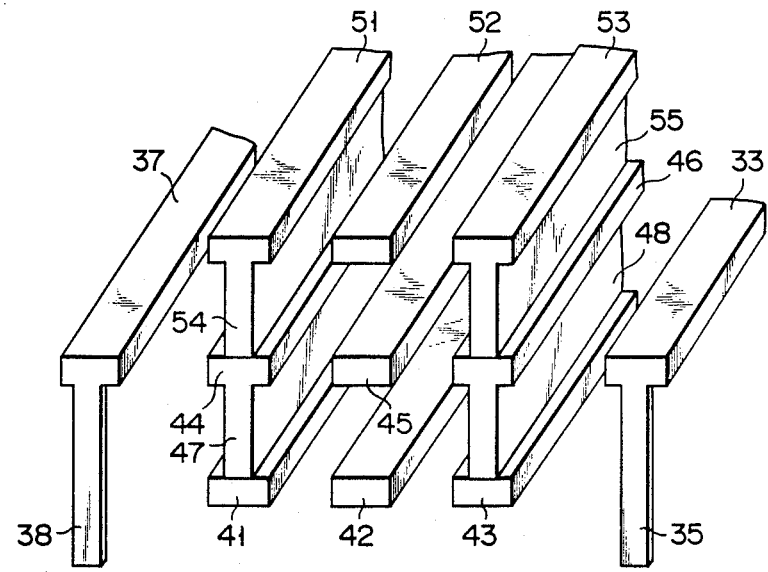
FIG. 10 is a perspective view of part of the semiconductor integrated circuit device shown in FIG. 9.

FIG. 10 discretely shows portions corresponding to drain wirings 33 and 37, drain lead-out electrodes 35 and 38, wirings 41 to 46, connection electrodes 47 and 48, wirings 51 to 53 and connection electrodes 54 and 55 of the device shown in FIG. 9. As shown in FIG. 10, wirings 41, 44 and 51 connected by means of connection electrodes 47 and 54 and wirings 43, 46 and 53 connected by means of connection electrodes 48 and 55 are disposed to extend in a longitudinal direction of drain wiring 37 or 33 and wirings 42, 45 and 52 and formed in a wall configuration. The wall-shaped wirings separate drain wiring 33 or 37 from wirings 42, 45 and 52.

In this embodiment, influence of the signal interference between the wirings can be suppressed to a minimum in the same manner as in the integrated circuit device of FIG. 6.

Figure 11:
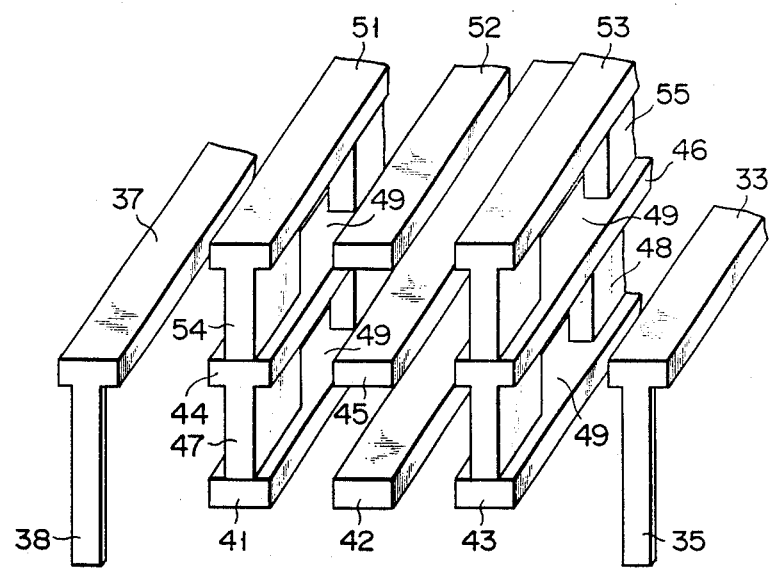
FIG. 11 is a perspective view of a modification of the semiconductor integrated circuit device shown in FIG. 9.

FIG. 11 is a modification of the embodiment of FIG. 9, and discretely shows portions corresponding to drain wirings 33 and 37, drain lead-out electrodes 35 and 38, wirings 41 to 46, connection electrodes 47 and 48, wirings 51 to 53 and connection electrodes 54 and 55 of the device shown in FIG. 9. In this modification, a desired number of holes 49 are formed in desired portions of connection electrodes 47, 48, 54 and 55. That is, in this modification, connection electrode 47 for connecting wirings 41 and 44, connection electrode 54 for connecting wirings 44 and 51, connection electrode 48 for connecting wirings 43 and 46 and connection electrode 55 for connecting wirings 46 and 53 are divided into a plurality of electrode portions, and portions in which none of connection electrodes 47, 54, 48 and 55 are formed correspond to holes 49.

With the integrated circuit device of the above multi-layered structure, when the distance between wirings becomes smaller with the miniaturization of elements, signal interferences occur not only between the wirings of the same layer but also between the wirings of different layers. However, the signal runaround effect can be suppressed by connecting the wirings of different layers by use of the connection electrode held at a constant potential so as to form a wall configuration, and thus influence of the signal interference between the wirings disposed on both sides of the connection electrode can be suppressed to a minimum. As a result, signals can be correctly transmitted along the wirings.

Figure 12:
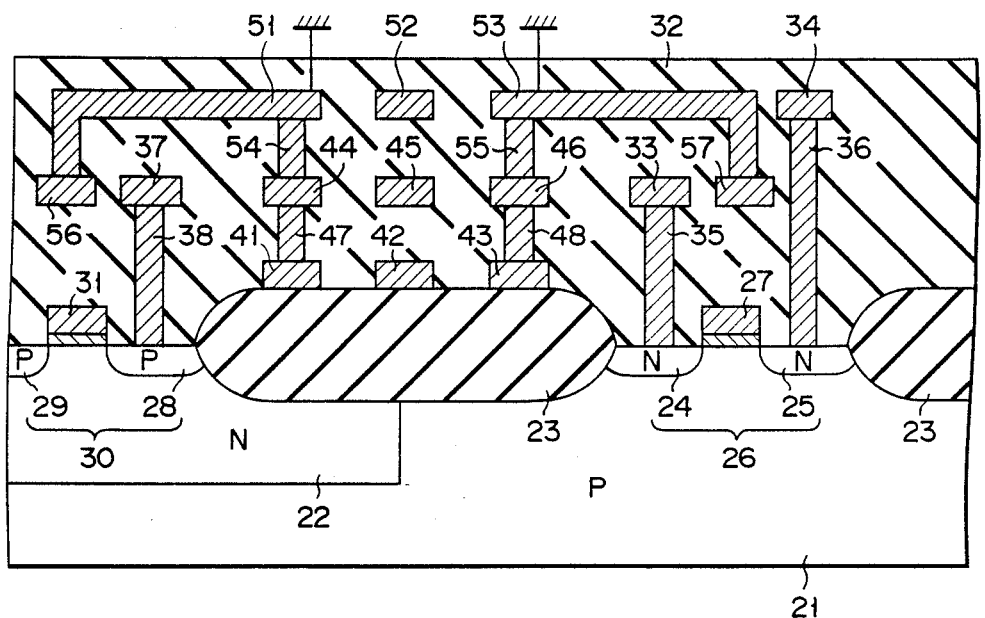
FIG. 12 is a cross sectional view of a modification of the semiconductor integrated circuit device shown in FIG. 9.

FIG. 12 shows another modification of the device shown in FIG. 9. In the device of this embodiment, when wirings 44 to 46 are formed by depositing the secondlayered metal on the entire surface of the semiconductor structure and then patterning the deposited metal layer, wiring 56 is formed in opposition to wiring 44 with drain wiring 37 set at the center therebetween and wiring 57 is formed in opposition to wiring 46 with drain wiring 33 set at the center therebetween. Further, when wirings 51 and 53 are formed by depositing the third-layered metal on the entire surface of the semiconductor structure and then patterning the deposited metal layer, the wirings are formed to extend to wirings 56 and 57, and wirings 51 and 53 are electrically connected to wirings 56 and 57.

With the construction described above, drain wiring 33, drain lead-out electrode 35, drain wiring 37 and drain lead-out electrode 38 are covered with the respective wirings 51, 53 held at the constant potential. As a result, influence of signal interferences between drain wiring 33, drain lead-out electrode 35, drain wiring 37 and drain lead-out electrode 38 and other respective wirings can be suppressed to a minimum.

This invention is not limited to the above embodiments and various modifications can be made. For example, in the above embodiments, the invention is applied to a CMOS semiconductor integrated circuit device in which influence of a signal interference between the drain wirings or between the drain wiring and the other wiring can be reduced. However, this invention can also be applied to various wirings in a semiconductor integrated circuit device in which the signal interference may occur. Further, in the above embodiments, each wiring is formed of metal such as aluminum which is a conductive material, but it can be formed of other conductive material such as polycrystalline silicon which has a lower resistance.

As described above, according to this invention, a semiconductor integrated circuit device can be provided in which element miniaturization and multi-layered structure can be attained without increasing influence of a signal interference between the wirings, and thus a signal can be correctly transmitted.

What is claimed is:

1. A semiconductor integrated circuit device comprising:
   a semiconductor body;
   an insulating layer formed on the semiconductor body;
   a first conductive layer disposed within the insulating layer;
   a first wiring constituting part of the first conductive layer and extending through the interior of the insulating layer in a predetermined direction, the first wiring being used for transmission of a first predetermined signal;
   second and third wirings constituting part of the first conductive layer and extending through the interior of the insulating layer in parallel to the first wiring, the second and third wirings being located on respective sides of the first wiring while each being isolated therefrom by a predetermined distance, the second and third wirings for being maintained at first and second predetermined potentials, respectively;
   a second conductive layer disposed within the insulating layer;
   a fourth wiring constituting part of the second conductive layer and extending through the interior of the insulating layer in parallel to the first wiring, the fourth wiring being located above the first wiring while being isolated therefrom by a predetermined distance, the fourth wiring being used for transmission of a second predetermined signal;
   a fifth wiring constituting part of the second conductive layer and extending through the interior of the insulating layer in parallel to the second wiring, said fifth wiring being located above the second wiring while being isolated therefrom by a predetermined distance, the fifth wire being located on a side of the fourth wiring while being isolated therefrom by a predetermined distance, and the fifth wiring being maintained at a third predetermined potential;
   a sixth wiring constituting part of the second conductive layer and extending through the interior of the insulating layer in parallel to the third wiring, the sixth wiring being located above the third wiring while being isolated therefrom by a predetermined distance, the sixth wiring being located on a side of the fourth wiring while being isolated therefrom by a predetermined distance, and the sixth wiring being maintained at a fourth predetermined potential;
   a seventh wiring constituting part of the second conductive layer, said seventh wiring being located on a side of the fifth wiring which is opposite to the side where the fourth wiring is located and being isolated therefrom by a predetermined distance, the seventh wiring extending through the interior of the insulating layer in parallel to the fifth wiring and being used for transmission of a third predetermined signal;
   an eighth wiring constituting part of the second conductive layer, the eighth wiring being located on a side of the sixth wiring which is opposite to the side where the fourth wiring is located and being isolated from the sixth wiring by a predetermined distance, the eighth wiring extending through the interior of the insulating layer in parallel to the sixth wiring and being used for transmission of a fourth predetermined signal;
   a first connecting electrode located between the second and fifth wirings and extending parallel thereto, the first connecting electrode electrically connecting the second and fifth wirings; and
   a second connecting electrode located between the third and sixth wirings and extending parallel thereto, the second connecting electrode electrically connecting the third and sixth wirings.

2. A semiconductor integrated circuit device according to claim 1, wherein the second, third, fifth and sixth wirings, and the first and second connecting electrodes are each maintained at a ground potential.

3. A semiconductor integrated circuit device according to claim 1, wherein the second, third, fifth and sixth wirings and the first and second connecting electrodes are each maintained at a power supply potential.

4. A semiconductor integrated circuit device according to claim 1, wherein each of the first and second connecting electrodes has a through-hole formed therein in a horizontal direction.

5. A semiconductor integrated circuit device, comprising:
   a semiconductor body;
   an insulating layer formed on the semiconductor body;
   a first conductive layer disposed within the insulating layer;
   a first wiring constituting part of the first conductive layer and extending through the interior of the insulating layer in a predetermined direction, the first wiring being used for transmission of a first predetermined signal;

second and third wirings constituting part of the first conductive layer and extending through the interior of the insulating layer in parallel to the first wiring, the second and third wirings being located on respective sides of the first wiring while being isolated therefrom by a predetermined distance, the second and third wirings for being maintained at first and second predetermined potentials, respectively;

a second conductive layer disposed within the insulating layer;

a fourth wiring constituting part of the second conductive layer and extending through the interior of the insulating layer in parallel to the first wiring, the fourth wiring being located above the first wiring while being isolated therefrom by a predetermined distance, the fourth wiring being used for transmission of a second predetermined signal;

a fifth wiring constituting part of the second conductive layer and extending through the interior of the insulating layer in parallel to the second wiring, the fifth wiring being located above the second wiring while being isolated therefrom by a predetermined distance, the fifth wiring being located on a side of the fourth wire while being electrically isolated therefrom by a predetermined distance, and the fifth wiring being maintained at a third predetermined potential;

a sixth wiring constituting part of the second conductive layer and extending through the interior of the insulating layer in parallel to the third wiring, the sixth wiring being located above the third wiring while being isolated therefrom by a predetermined distance, the sixth wiring being located on a side of the fourth wiring while being isolated therefrom by a predetermined distance, and the sixth wiring being maintained at a fourth predetermined potential;

a seventh wiring constituting part of the second conductive layer, said seventh wiring being located on a side of the fifth wiring which is opposite to the side in which the fourth wiring is located, and being isolated therefrom by a predetermined distance, the seventh wiring extending through the interior of the insulating layer in parallel to the fifth wiring and being used for transmission of a third predetermined signal;

an eighth wiring constituting part of the second conductive layer, the eighth wiring being located on a side of the sixth wiring which is opposite to the side in which the fourth wiring is located, and being isolated from the sixth wiring by a predetermined distance, the eighth wiring extending through the interior of the insulating layer in parallel to the sixth wiring and being used for transmission of a fourth predetermined signal;

a first connecting electrode located between the second and fifth wirings and extending parallel thereto, the first connecting electrode electrically connecting the second and fifth wirings;

a second connecting electrode located between the third and sixth wirings and extending parallel thereto, the second connecting electrode electrically connecting the third and sixth wirings;

a third conductive layer disposed within the insulating layer;

a ninth wiring constituting part of the third conductive layer, and extending through the interior of the insulating layer in parallel to the fourth wiring, said ninth wiring being located above the fourth wiring while being isolated therefrom by a predetermined distance, the ninth wiring being used for transmission of a fifth predetermined signal;

a tenth wiring constituting part of the third conductive layer and extending through the interior of the insulating layer in parallel to the fifth wiring, the tenth wiring being located above the fifth wiring while being isolated therefrom by a predetermined distance, said tenth wiring being maintained at a fifth predetermined potential;

an eleventh wiring constituting part of the third conductive layer and extending through the interior of the insulating layer in parallel to the sixth wiring, the eleventh wiring being located above the sixth wiring while being isolated therefrom by a predetermined distance, the eleventh wiring being maintained at a sixth predetermined potential;

a third connecting electrode located between the fifth and tenth wirings and extending parallel thereto, the third connecting electrode electrically connecting the fifth and tenth wirings; and a fourth connecting electrode located between the sixth and eleventh wirings and extending parallel thereto, the fourth connecting electrode electrically connecting the sixth and eleventh wirings.

6. A semiconductor integrated circuit device according to claim 5, wherein the second, third, fifth, sixth, tenth, and eleventh wirings and the first, second, third, and fourth connecting electrodes are each maintained at a ground potential.

7. A semiconductor integrated circuit device according to claim 5, wherein the second, third, fifth, sixth, tenth, and eleventh wirings and the first, second, third and fourth connecting electrodes are each maintained at a power supply potential.

8. A semiconductor integrated circuit device according to claim 5, wherein each of the first, second, third, and fourth connecting electrodes has a through-hole formed therein in a horizontal direction.

* * * * *